United States Patent
Tekletsadik et al.

(10) Patent No.: US 9,912,148 B2
(45) Date of Patent: Mar. 6, 2018

(54) SUPERCONDUCTING FAULT CURRENT LIMITER SYSTEM

(71) Applicant: Varian Semiconductor Equipment Associates, Inc., Gloucester, MA (US)

(72) Inventors: Kasegn D. Tekletsadik, Middleton, MA (US); Charles L. Stanley, Amesbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 424 days.

(21) Appl. No.: 13/835,434

(22) Filed: Mar. 15, 2013

(65) Prior Publication Data

US 2014/0268453 A1    Sep. 18, 2014

(51) Int. Cl.
*H02H 9/00* (2006.01)
*H02H 9/02* (2006.01)
*H01L 39/16* (2006.01)

(52) U.S. Cl.
CPC ............ *H02H 9/023* (2013.01); *H01L 39/16* (2013.01); *Y02E 40/69* (2013.01)

(58) Field of Classification Search
USPC ..................................................... 361/19, 57
See application file for complete search history.

(56) References Cited

U.S. PATENT DOCUMENTS

| 3,325,695 A | 6/1967 | Brunette |
| 2007/0127171 A1 | 6/2007 | Lee et al. |
| 2008/0043382 A1 * | 2/2008 | Lee et al. ........................ 361/19 |
| 2010/0296208 A1 | 11/2010 | Tekletsadik |
| 2011/0177953 A1 | 7/2011 | Llambes et al. |
| 2012/0044603 A1 | 2/2012 | Dommerque |
| 2012/0316069 A1 | 12/2012 | Murphy et al. |

FOREIGN PATENT DOCUMENTS

| CN | 1417818 A | 5/2003 |
| CN | 201887459 U * | 6/2011 |
| EP | 0399481 A1 | 11/1990 |
| GB | 1056248 A * | 1/1967 |
| GB | 2156156 A | 10/1985 |
| KR | 1020111074872 B1 | 10/2011 |

OTHER PUBLICATIONS

International Search Report and Written Opinion, mailed Jul. 21, 2014 for PCT/US2014/022406 filed Mar. 10, 2014.

* cited by examiner

*Primary Examiner* — Thienvu Tran
*Assistant Examiner* — Nicolas Bellido

(57) ABSTRACT

A current limiter system includes a superconducting fault current limiter (SCFCL) operative to conduct load current during a normal operation state in which the SCFCL is in a superconducting state. The current limiter system also includes a shunt reactor connected in an electrically parallel fashion to the SCFCL and configured to conduct less current than the SCFL in the normal operation state, and a protection switch connected in electrical series with the SCFCL and shunt reactor and configured to disconnect the SCFCL for a predetermined time from a load current path during a fault condition after fault current exceeds a threshold current value.

19 Claims, 10 Drawing Sheets

SUPERCONDUCTING FAULT CURRENT LIMITER SYSTEM

FIELD

This invention relates to current control devices, more particularly, to an apparatus for fault current limiting.

BACKGROUND

Fault current limiters are used to provide protection against current surges, for example in a power transmission network. Superconducting Fault Current Limiters (SCFCL) are a class of devices that operate at a cryogenic temperature and are typically used in electrical transmission or distribution lines that are subjected to high voltages and high currents. In a resistive SCFCL, the current passes through the superconductor component of the SCFCL such that when a high fault current begins, the superconductor quenches. In other words, the superconductor becomes a normal conductor where the resistance rises sharply and quickly.

A core of a SCFCL device may consist of several superconducting elements that are interconnected in series and parallel using non-superconducting connectors, which may dissipate power and increase cryogenics thermal load. In a normal operating mode, the SCFL device is cooled to cryogenic temperatures in order for the superconducting elements, such as tapes, to enter the superconducting state. When a current surge takes place along a transmission line, the current may enter the SCFCL, at which point it travels through the superconducting elements. If the current surge exceeds a critical value of current density in the superconducting tapes, the superconducting material may transform into a normal conductor (i.e. quench). Once in the normal conducting state, the superconductor material acquires a finite resistance to current which may limit the current conducted through the SCFCL to acceptable levels, thereby regulating the current conducted along the transmission lines.

In conventional SCFCL systems, the SCFCL presents nearly-zero impedance to a current load during normal operation, and inserts a large limiting impedance in the event of a fault condition such as, for example, a short circuit in order to reduce the fault current. An additional requirement for proper operation of an SCFCL is that after a fault condition is cleared, the SCFCL recovers rapidly within seconds to its former superconducting state in order to limit current in other fault events that may occur.

Currently, a major remaining challenge is the ability of an SCFCL to recover when a load current is carried through the SCFCL during a recovery period. SCFCLs that are under active development include, among others, systems using magnesium diboride wire, Yttrium Barium Copper Oxide (YBCO) tape, or Bismuth Strontium Calcium Copper Oxide (BSSCO) materials, which are cooled to below their respective superconducting transition temperatures ($T_c$) in order to function as designed. YBCO and BSSCO-based devices are attractive because the $T_c$ in typical commercial materials is in the range of 90°-105° K, allowing SCFCL devices to operate using relatively inexpensive liquid nitrogen or boiling nitrogen cooling. However, when an SCFCL such as a YBCO or BSSCO system quenches and enters a state of finite resistance during a fault, the persistence of load current drawn through such an SCFCL may be problematic. In particular, load current drawn through YBCO or BSSCO (or other) elements that have a finite resistance may result in unwanted heating of the superconductor elements. Even a modest current drawn through the SCFCL may delay the return of the superconductor material to its superconducting state, thereby compromising performance of the fault limiting system. In a worst case, the SCFCL system may not recover at all and the superconducting elements of the SCFCL may remain as normal state conductors. It will be apparent therefore that improvements are desirable over known SCFCL systems.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a current limiter system includes a superconducting fault current limiter (SCFCL) operative to conduct load current during a normal operation state in which the SCFCL is in a superconducting state. The current limiter system also includes a shunt reactor connected in an electrically parallel fashion to the SCFCL and configured to conduct less current than the SCFL in the normal operation state, and a protection switch connected in electrical series with the SCFCL and shunt reactor and configured to disconnect the SCFCL for a predetermined time from a load current path during a fault condition after fault current exceeds a threshold current value.

In an additional embodiment, a superconducting fault current limiter (SCFCL) system arranged in an electrical circuit includes a first electrical path containing an SCFCL configured to conduct load current during a normal operation state in which the SCFCL is in a superconducting state, a second electrical path electrically parallel to the first electrical path and containing a shunt reactor configured to conduct less current than the SCFL in the normal operation state, and a protection component configured to form a series connection with the first electrical path containing the SCFCL and with the second electrical path containing the shunt reactor, the protection switch further configured to create an open circuit along the first electrical path containing the SCFCL for a predetermined time when the current exceeds a threshold current value, wherein no load current is conducted through the SCFCL.

DETAILED DESCRIPTION

Figure 1:
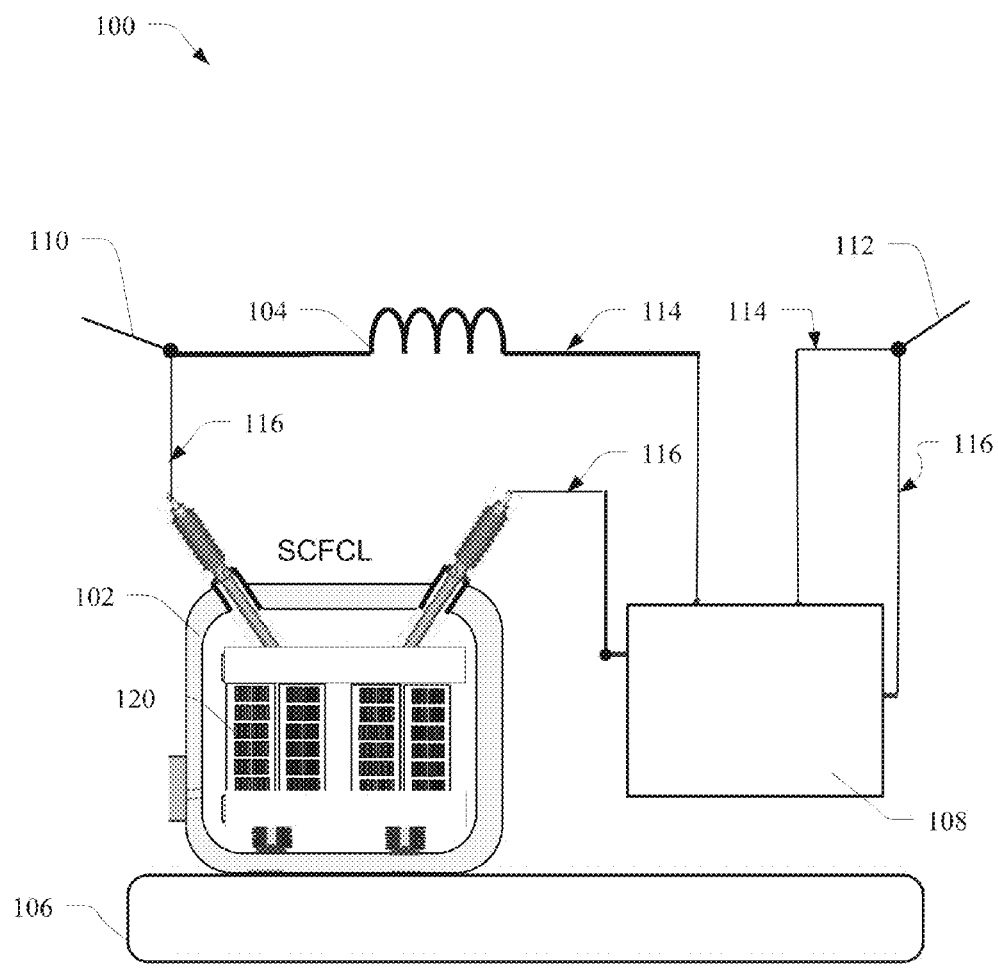
FIG. 1 depicts a current limiting system in accordance with one embodiment.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

To address some of the deficiencies in the aforementioned SCFCLs, embodiments are described herein that provide improved SCFCL architecture and performance. As noted above, in conventional SCFCL systems, the SCFCL presents nearly zero impedance to a current load during normal operation, and much larger impedance to the current during a fault condition when the SCFCL is no longer in a superconducting state. However, during a fault recovery period after a fault event has cleared, a persistent load current that passes through the SCFCL in a conventional SCFCL system may hinder return of the SCFCL to the superconducting state.

To address this situation, the present embodiment provides a protection system such as a protection switch or a circuit breaker connected in series with an SCFCL to disconnect the SCFCL from load current during a recovery period. Advantageously, this allows the superconductor elements of the SCFCL that are in a finite resistance state to undergo a transition more rapidly back to a superconducting state. The terms "finite resistance state" and "finite resistivity state" both refer to the state of a superconductor material in which the superconductor material is in a non-superconducting state, which may be characterized by metallic, semi-metallic, or semiconductive resistance properties. A superconductor material exists in a finite resistance state when the superconductor material has a temperature in excess of a critical temperature $T_c$ for superconductivity, and/or when current passing through the superconductor material exceeds a critical current.

Further advantageously, the protection system may harness the load or fault current to power the protection circuit. More particularly, the protection system may be configured to be activated by load or fault current, thereby avoiding the need for complex circuitry. Other advantages afforded by this arrangement are the reduced design complexity for the whole SCFCL system and the reduced amount of superconductor material required for SCFCL elements.

FIG. 1 depicts general architecture of an SCFCL system 100 consistent with embodiments of the disclosure. The SCFCL system 100 includes an SCFCL 102, which may be a conventional SCFCL except as otherwise noted herein with respect to the description to follow. The SCFCL system further includes a shunt reactor 104, which may be a conventional shunt reactor, an insulation system 106, and a protection element 108.

In operation, the SCFCL system 100 provides fault current protection by limiting fault current (not separately shown) that passes between entry point 110 and exit point 112 (the designation of "entry point" as opposed to "exit point" is arbitrary in FIG. 1). Under normal operation mode a load current may periodically, occasionally, or continuously pass through the SCFCL system. The load current in normal operation mode exhibits a current level such that the superconductor elements 120 remain in a superconducting state and therefore transmit the load current through the superconductor elements 120 with zero resistance when the load current passes through the SCFCL 102. Accordingly, the load current is transmitted with relatively lower resistance through the SCFCL, which includes resistive points including normal state metals and connection points. During a fault condition in which an excessive fault current may be rapidly generated, the superconductor elements 120 react to the excessive fault current by transforming from a superconducting state to a finite resistivity state, which places a large overall impedance to the excessive fault current, thereby limiting the fault current during the fault condition. Subsequently, with the aid of a protection element, such as protection element 108, the superconductor elements 120 may return to a superconducting state to regulate current by limiting current in future fault events.

As further illustrated in FIG. 1, the SCFCL system 100 forms two parallel electrical paths 114, 116, which branch between entry point 110 and exit point 112. Accordingly, the SCFCL 102 and shunt reactor 104 are arranged in an electrically parallel fashion in the SCFCL system 100 along the respective electrical paths 114 and 116. Under normal operation mode the electrical path 116 represents the load current path, such that the SCFCL system 100 is configured to draw approximately one hundred percent of load current through the SCFCL 102 and approximately zero percent of load current through the shunt reactor 104. However, when a fault condition or event occurs, the shunt reactor is configured to draw a majority of the fault current, thereby limiting the current passing through the SCFCL.

As further illustrated in FIG. 1, the protection element 108 is arranged electrically in series with both the SCFCL 102 and shunt reactor 104. Unlike the SCFCL recovery operation provided in conventional SCFCL systems, the protection element 108 is configured to prevent any load current from being conducted through the SCFCL 102 during recovery from a fault condition. This is advantageous over prior art SCFCL systems because, even though a conventional shunt reactor may reduce current that passes through the SCFCL during a surge of load current caused by fault, a moderate current may still be conducted through the SCFCL during recovery. In particular, if current passing through the SCFCL 102 exceeds a threshold current, which may be set so that a typical fault current exceeds the threshold current, the protection element 108 is configured to create an "open" along the load current path, that is, electrical path 116, such that all current passes through the shunt reactor along electrical path 114. This allows the superconductor elements 120, which may have been rendered into the finite resistance state, to recover more rapidly to a superconducting state. In various embodiments, the protection element 108 is an electromagnetic switch or a circuit breaker type device that is activated as detailed below.

Figure 2:
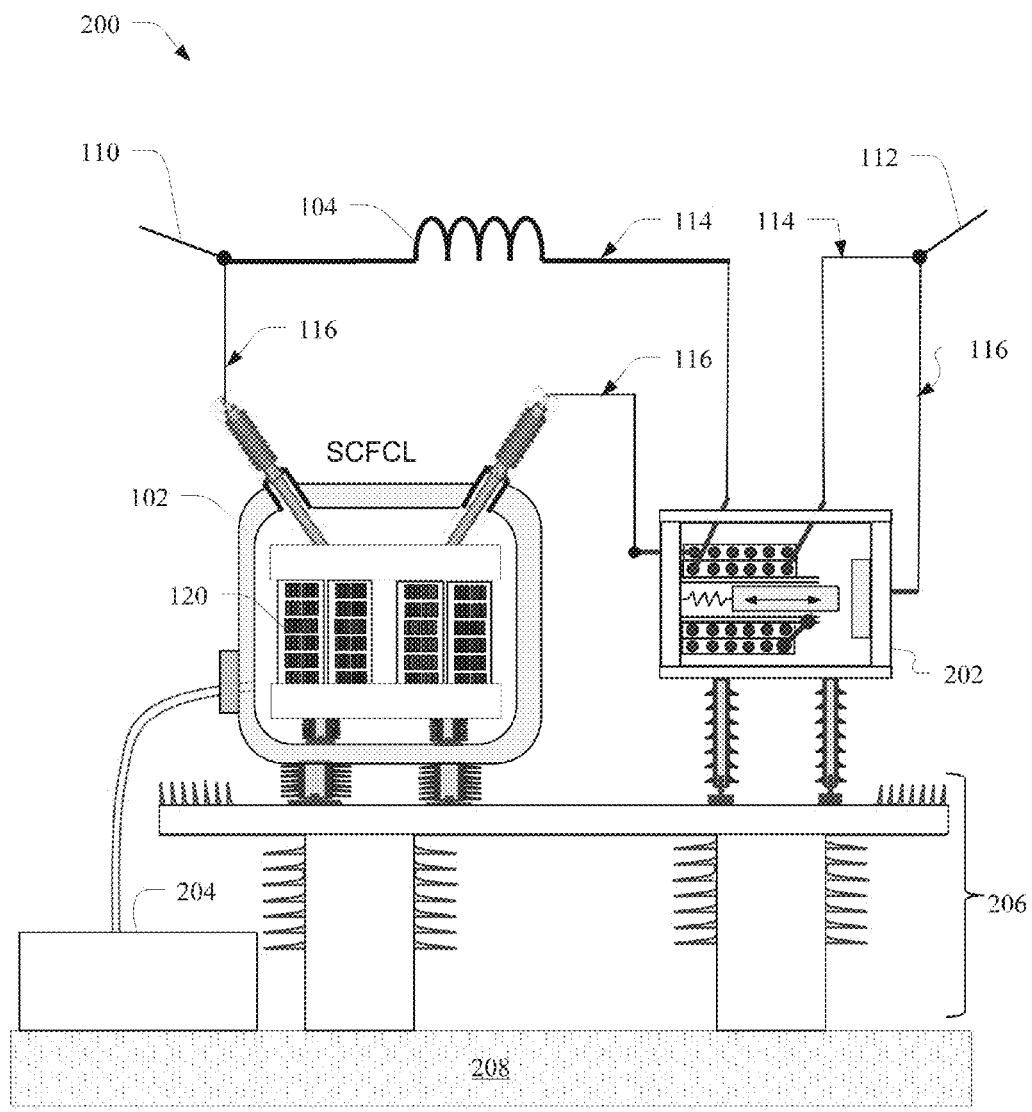
FIG. 2 depicts a current limiting system in accordance with another embodiment.

FIG. 2 depicts an embodiment of an SCFCL system 200 in which a protection element is a protection switch 202. The protection switch 202 is configured to pass current through the electrical path 116 during normal operation mode of the SCFCL system 200, and is further configured to open the electrical path 116 such that no current flows through the SCFCL 102 in response to a current surge during a fault condition. In the embodiment of FIG. 2 the protection switch 202 is an electromagnetic switch in which a current that passes between entry and exit points 110, 112 is used to power electromagnetic coils within the electromagnetic switch in order to control switch positions as discussed further with respect to FIG. 3. SCFCL system 200 also includes a cooling system 204, which may be a cryostat or liquid nitrogen tank in alternative embodiments. The cooling system 204 is used to maintain the superconductor elements 120 at a temperature below the Tc for superconductor elements 120. The SCFCL system 200 further includes high voltage insulation 206 to electrically isolate the SCFCL 102 and protection switch 202 from ground 208.

Figure 3A:
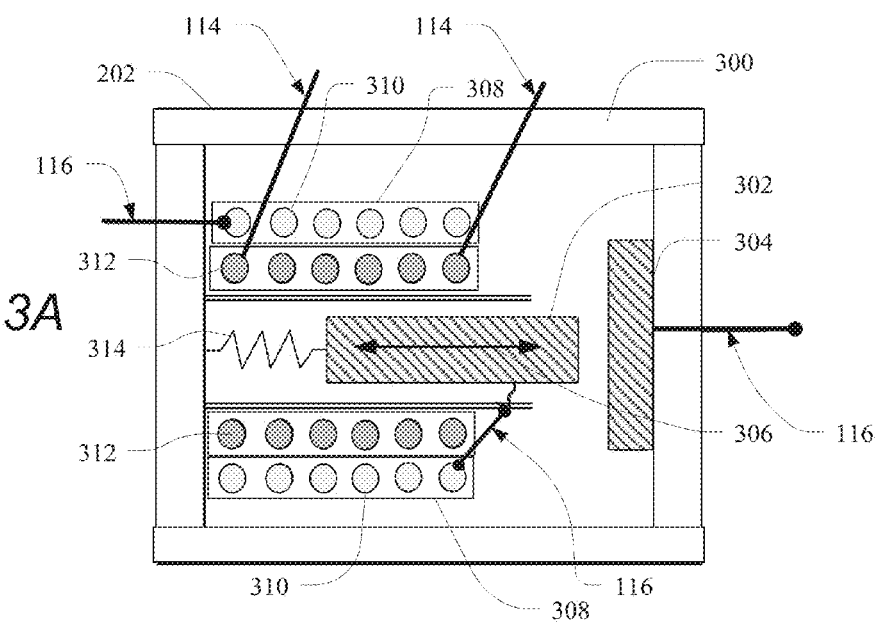
FIG. 3A depicts an exemplary protection switch for use in a current limiting system.

FIG. 3A depicts details of the protection switch 202, including an enclosure 300, central magnetic component 302, a contact 304, and set of electromagnetic coils 308. In the embodiment of FIG. 3A, the central magnetic component 302 is a magnetic plunger that is configured to move along the direction 306 in accordance with the strength of a magnetic field generated by the set of electromagnetic coils 308. The set of electromagnetic coils 308 includes an electromagnetic coil 310 connected in series with the SCFCL 102 along the electrical path 116, and an electromagnetic coil 312 connected in series with the shunt reactor 104 along the electrical path 114. In particular, the electromagnetic coil 312, which is electrically connected to the SCFCL 102, is also electrically connected to the central magnetic component 302. Contacts 302 and 304 are placed or enclosed in a dielectric medium such as, air, vacuum, inert gases, SF6, oil or any medium that is known to eliminate or minimize contact material erosion caused by arc produced during the contacts opening or closing operations.

Figure 3B:
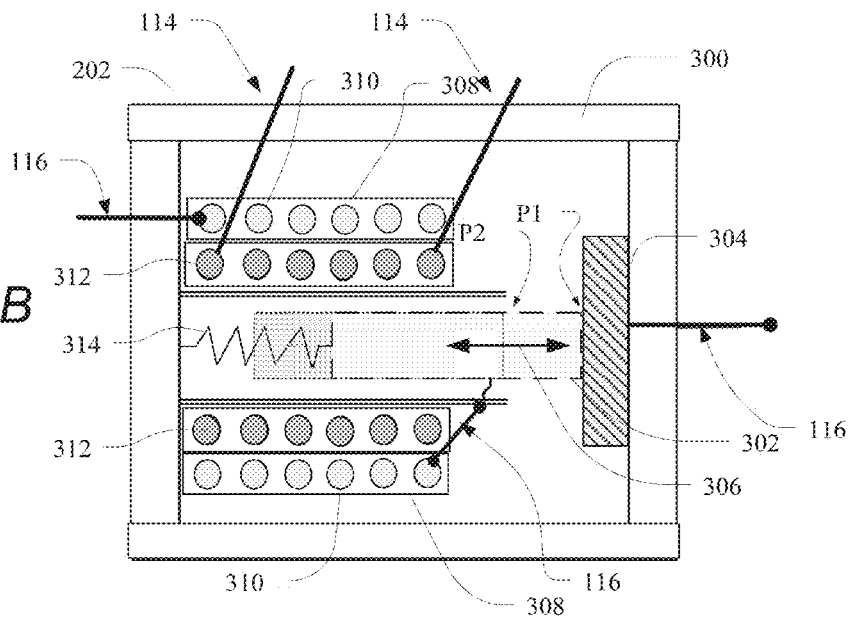
FIG. 3B depicts further details of operation of the protection switch of FIG. 3A.

FIG. 3B illustrates operation of the central magnetic component 302. As illustrated, the central magnetic component 302 is configured to move along the direction 306 between a position P1 and position P2. When zero load current or low load current passes through the set of electromagnetic coils 308, the protection switch 202 is configured to place the central magnetic component 302 in a closed position at position P1 where electrical contact is made between the central magnetic component 302 and the contact 304. In this closed position the electrical path 116 between entry point 110 and exit point 112 is closed and electrical current may flow through the SCFCL 102. In particular, current may flow from entry point 110 through SCFCL 102, thence through electromagnetic coil 310, central magnetic component 302, contact 304 and exit point 112.

During the normal operation mode, for example, when load current is present, nearly the entire load current passes along the electrical path 116 and little if any load current passes through the electrical path 114. Accordingly, nearly the entire current that travels through the set of electromagnetic coils 308 passes through the electromagnetic coil 310. However, the protection switch 202 is configured such that this load current is insufficient to generate a magnetic force to break contact between the central magnetic component 302 and contact 304. A typical load current that an SCFCL 102 may experience under normal operation conditions may vary between zero and 2000 A, while in one example the spring 314 of the protection switch 202 may be configured to maintain the central magnetic component 302 against the contact 304 when up to 3 kA flows through the set of electromagnetic coils 308.

In some embodiments of the disclosure, instrumentation including monitoring devices may be coupled to the electromagnetic coil 310 to operate from voltage generated by the electromagnetic coil 310.

Referring also to FIG. 2, in various embodiments of the disclosure at the onset of a fault event the SCFCL system 200 is configured such that greater than eighty percent of fault current is conducted through the shunt reactor 104 along the electrical path 114, while less than twenty percent of fault current is conducted along the electrical path 116. Accordingly, during an initial fault interval, that is, during the initial period of a fault event, a majority of current flows through the electromagnetic coil 312, while a smaller current flows through the electromagnetic coil 310.

As noted, during a fault event, when the fault current exceeds a threshold current, the protection switch 202 is configured to create an open circuit along the electrical path 116 such that no current flows between entry point 110 and exit point 112 along the electrical path 116. In particular, the set of electromagnetic coils 308 is configured to exert a force that is effective to move the central magnetic component 302 from a closed position to an open position when the fault current exceeds the threshold current. This is accomplished by generating a sufficient magnetic field to move the central magnetic component 302 away from the contact 304 such that electrical contact is broken between the central magnetic component 302 and contact 304. The separation of the central magnetic component 302 from the contact 304 is proportional to fault current transmitted through the set of electromagnetic coils 308. As more current is drawn through the set of electromagnetic coils 308 a greater magnetic field is generated, which field acts upon the central magnetic component 302 to exert a magnetic force to urge the central magnetic component 302 away from the contact 304. This magnetic force is opposed by a restoring force of the spring 314, which may be set to maintain contact between the central magnetic component 302 and contact 304 until a desired threshold current is exceeded. The magnitude of the electromagnetic force plays another role to vary the speed of the contact separation. As the electromagnetic force increases with higher fault currents, the speed of contact separation increases and hence the switch breaks the fault in shorter time. This shorter "clearing" time results in less energy absorption into the superconductor and as a result reduces the overheating of superconductors. This mechanism helps to reduce the amount of superconductor used in an SCFCL design. In various embodiments, the value of the threshold current may vary according to application of an SCFCL, but in some embodiments may be 2.5 kA or higher.

In the example of FIG. 3B, the central magnetic component 302 may be driven away from the contact 304 to a position P2 when a fault current having a given value that exceeds a threshold current is present. Subsequently, as the fault event clears and load current subsides, the current passing through electromagnetic coil 312 decreases to the extent that the spring 314 moves the central magnetic component 302 back to the position P1 and contact is restored between the central magnetic component 302 and the contact 304. Consistent with various embodiments of the disclosure, the spring response for the spring 314 may be set so that the duration required to restore contact between central magnetic component 302 and contact 304 is between one and twenty seconds. In particular embodiments, this duration may be set between one and six seconds. The spring response may be set to allow sufficient time for superconductor elements 120 to recover to the superconducting state before current passes through the SCFCL 102. This may help avoid delay in recovery of the superconductor elements 120 that may otherwise take place if current were drawn through the superconductor elements 120 after a fault condition cleared when the superconductor elements are in a finite resistance state. In such circumstances, any load current drawn through the superconductor elements 120 may induce resistive heating or other deleterious effects that delay or prevent the superconductor elements from transitioning to a superconducting state.

Figure 4A:
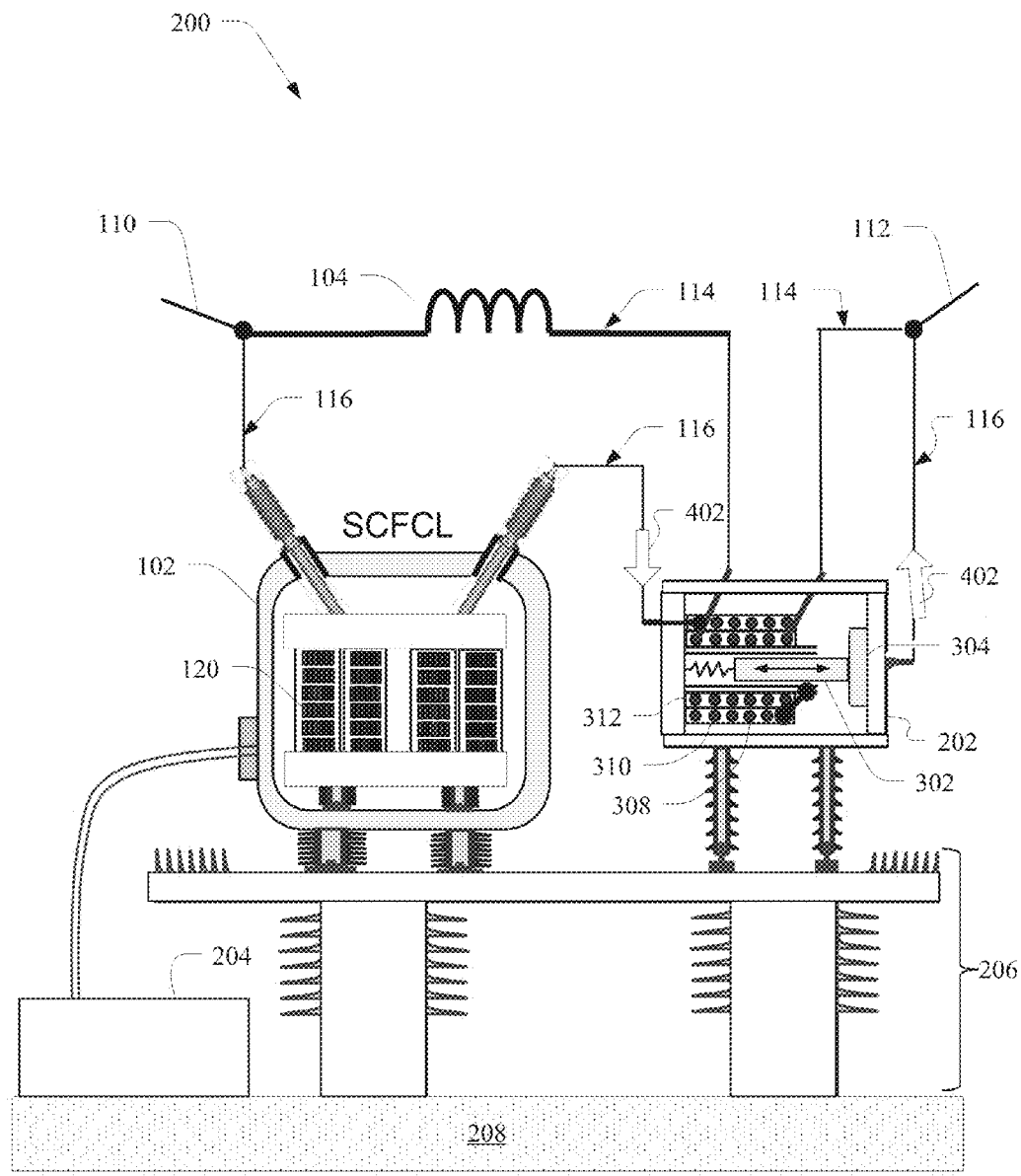
FIG. 4A depicts one instance of use of a current limiting system consistent with a further embodiment.

FIGS. 4A to 4D further illustrate different stages of operation of the SCFCL system 200 consistent with embodiments of the disclosure. In particular FIG. 4A depicts one instance of use of the SCFCL system 200 during so-called normal operation mode. As illustrated, a load current 402 passes along the electrical path 116 through the SCFCL 102 and electromagnetic coil 310. The load current is not sufficient to drive the central magnetic component 302 away from the contact 304 and the electrical path 116 therefore remains intact. At the same, the shunt reactor 104 and SCFCL are configured so that little or no current is drawn through the electrical path 114.

Figure 4B:
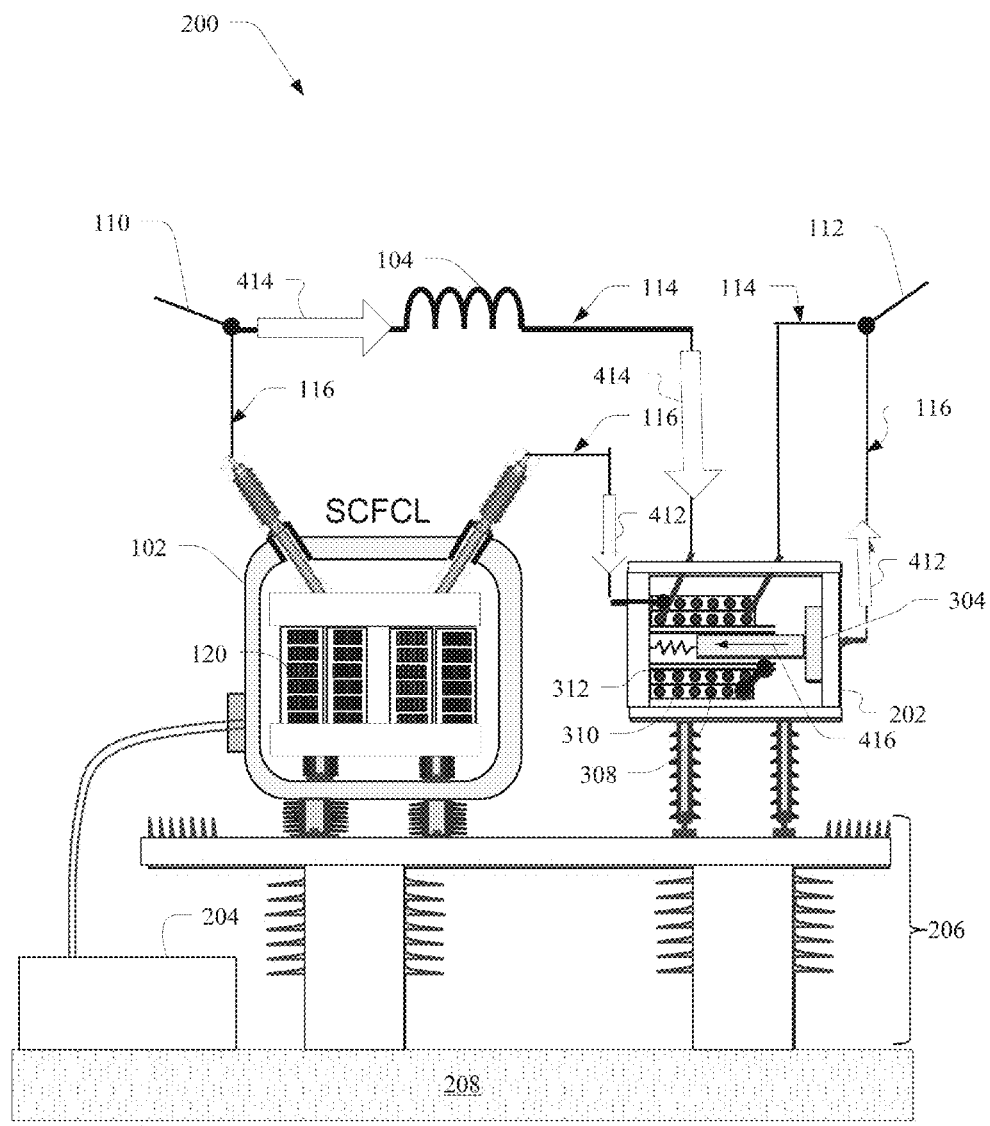
FIG. 4B depicts another instance of use of the current limiting system of FIG. 4A.

FIG. 4B depicts one instance the SCFCL system 200 during an early stage of a fault event in which excessive current is drawn through the SCFCL system 200. As noted, the SCFCL system 200 is configured to limit current during a fault event by the use of the superconductor elements 120, which transition into finite resistance state that generate a large impedance to current along the electrical path 116. At the same time the SCFCL system 200 is configured so that fault current 414 is drawn along the electrical path 114 through the shunt reactor 104 is larger than the fault current 412 drawn through the SCFCL 102. In some embodiments, during an initial period of a fault condition when fault current is greater than about 5 kA, the fraction of fault current drawn by the SCFCL is less than 20% of total fault current. In one example the SCFCL 102 may be configured as a 138 kV SCFCL with 1200 A load current under normal operation and may draw about 5 kA fault current through the SCFCL 102 of a total 25 kA fault current during a fault.

In the example of FIG. 4B, the fault current 414 and fault current 412 generate a magnetic field that exerts a force along the direction 416 that urges the central magnetic component 302 away from contact 304. When fault currents 414 and 412 together are sufficiently large, that is, when they exceed a threshold current, the protection switch 202 causes the central magnetic component 302 to break contact with the contact 304. In alternative embodiments, either of fault currents 414 or 412, but not both, may be employed to break the contact of the central magnetic component 302 with contact 304. In this configuration only one coil may be wound and used.

Figure 4C:
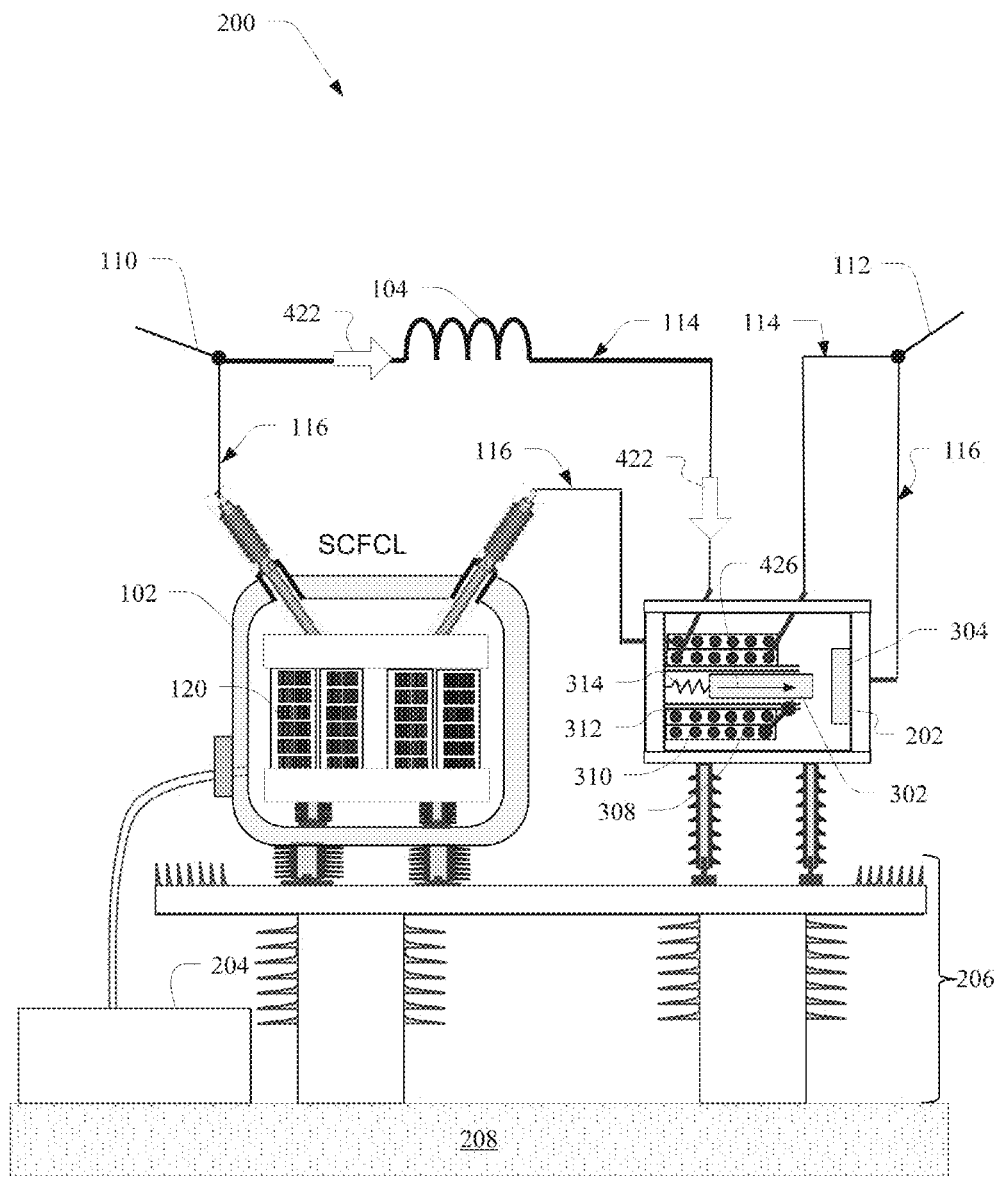
FIG. 4C depicts a further instance of use of the current limiting system of FIG. 4A.

FIG. 4C depicts a further scenario following the examples depicted in FIGS. 4A and 4B in which contact has been broken between the central magnetic component 302 and the contact 304 in response to a fault event that temporarily generates an excess current. Accordingly, because the protection switch 202 is in electrical series with the SCFCL 102 no current is drawn through the electrical path 116. At the instance depicted in FIG. 4C, the excessive current generated by the fault event has decreased such that the fault current 422 drawn through the electrical path 116 decreases in comparison to the fault current 412 present at early stages of the fault event. Because of this decreased fault current 412 that passes through the electromagnetic coil 312, the restorative force of the spring 314 is greater than a force generated by a magnetic field produced by the set of electromagnetic coils 308, resulting in movement of the central magnetic component 302 towards the contact 304.

In various embodiments, as noted above, the spring constant of spring 314 is such that central magnetic component 302 is returned to abut against the contact 304 after one to twenty seconds subsequent to the time at which load current through electrical path 116 drops to a small value or zero after the fault condition is cleared. In the interim, during the scenario of FIG. 4C, the superconductor elements 120 begin to return to a superconducting state. Because no current can traverse the superconductor elements 120, this transition from finite resistance state to superconducting state may take place much more rapidly.

Figure 4D:
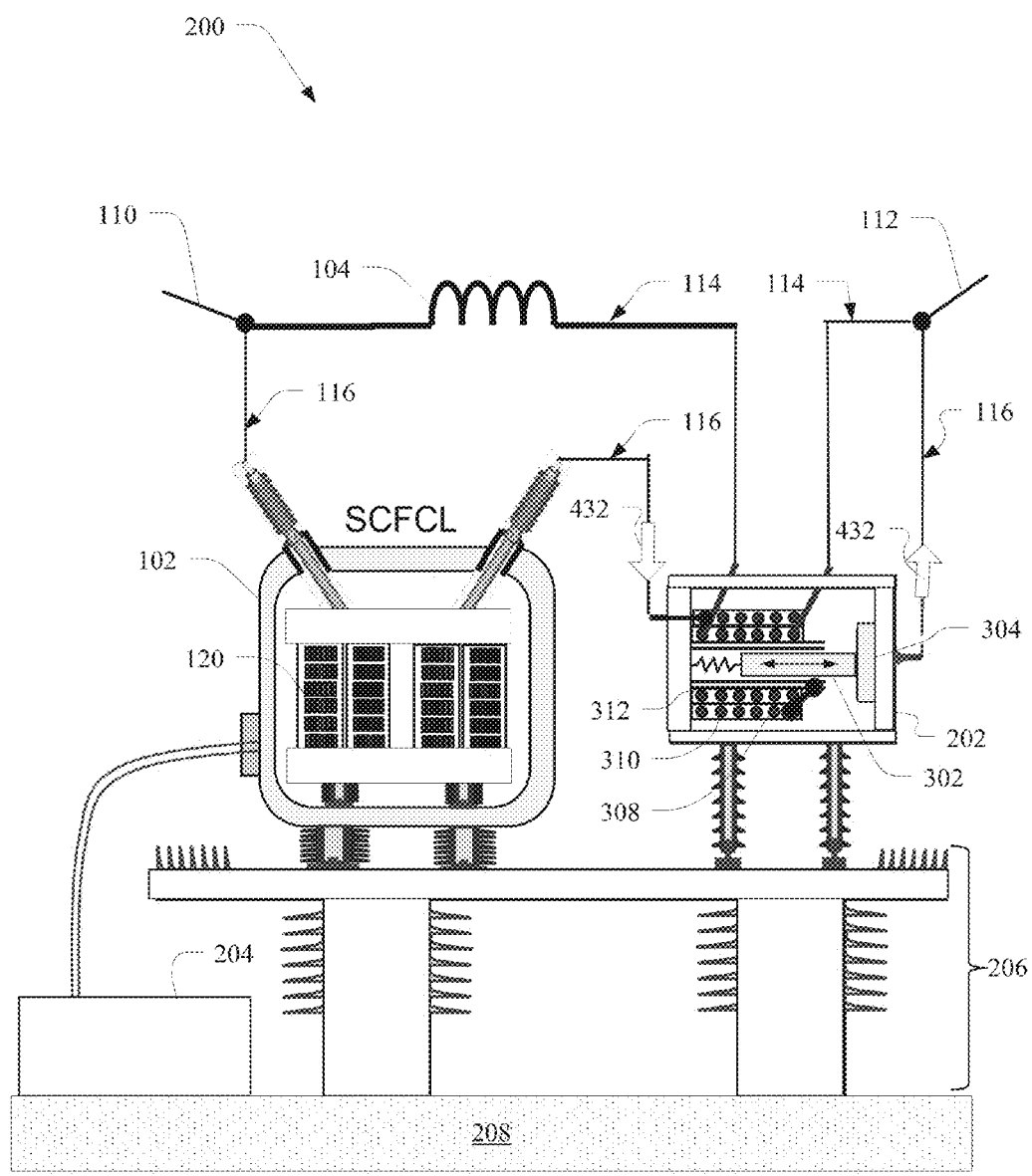
FIG. 4D depicts yet another instance of use of the current limiting system of FIG. 4A.

FIG. 4D depicts an instance subsequent to that shown in FIG. 4C following the examples depicted in FIGS. 4A to 4C. At this instance the SCFCL system 200 has recovered from the fault condition, and the central magnetic component 302 has been brought back into contact with the contact 304. As illustrated, a small load current 432 passes through the electrical path 116 while little or no current passes through the electrical path 114.

Figure 7:
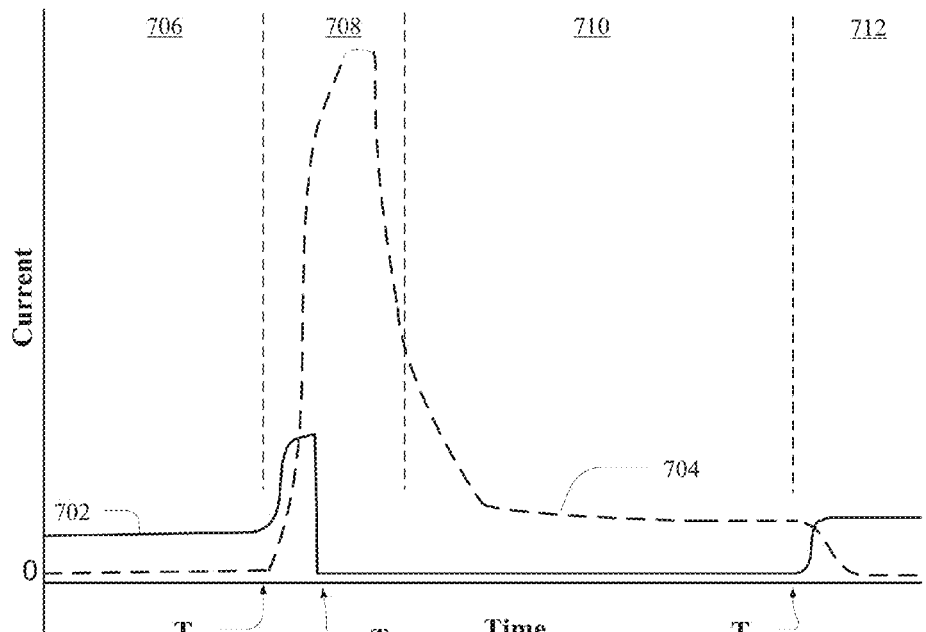
FIG. 7 shows exemplary current curves for an SCFCL system in accordance with the present embodiments.

FIG. 7 shows exemplary current curves that further illustrate operation the function of an SCFCL system in accordance with the present embodiments. In FIG. 7 there are shown two exemplary current curves 702 and 704 for current drawn along the electrical paths 116 and 114, respectively. During an initial normal operation period 706, the current level of current conducted through the SCFCL 102 (see FIG. 2) is relatively low, such as below a few thousand amps. Current drawn through the shunt reactor 104 is negligible or zero. At a time T1, a fault condition occurs leading to a rapid rise in current drawn through the SCFCL 102, as illustrated by the current curve 702. However, this simultaneously engenders a transition of superconductor elements 120 into finite state resistance, which greatly increases impedance along the electrical path 116, resulting in a limited increase in the current level of the current curve 702. A maximum value of several thousand amps may result in some cases. At the same time during the fault period 708 the shunt reactor 104 is configured to draw a fault current resulting in a relatively larger current level in current drawn along the electrical path 114.

At the time T2, the total current represented by current curves 702 and 704 exceeds a threshold, which opens the protection switch 202, causing the current curve 702 to instantly decrease to zero. During a subsequent recovery period 710, no current flows through the electrical path 116, while the fault current decays and a finite current persists in the electrical path 114 as illustrated by the current curve 704. In the recovery period 710, which may last several seconds or more, superconductor elements 120 experience no current draw facilitating their recovery to a superconducting state. At the time T3 the spring 314 closes the protection switch 202, resulting in renewed current draw through the electrical path 116 in a subsequent period 712 of normal operation of the SCFCL system 200. In some embodiments, the protection switch 202 may be configured to provide sufficient time for full recovery to superconducting state of the superconductor elements 120.

It is to be noted that the duration in which the protection switch remains open between the time T2 and time T3 may be set to optimize performance of an SCFCL system. For example, it may be desirable to minimize the time in which the SCFCL 102 is "off-line" in which the electrical path 116 is open. In such case, the protection switch 202 may be designed to remain open for only three seconds, for example, even if full recovery of all superconductor elements 120 may on average be expected to require four seconds in the absence of current load.

Figure 5:
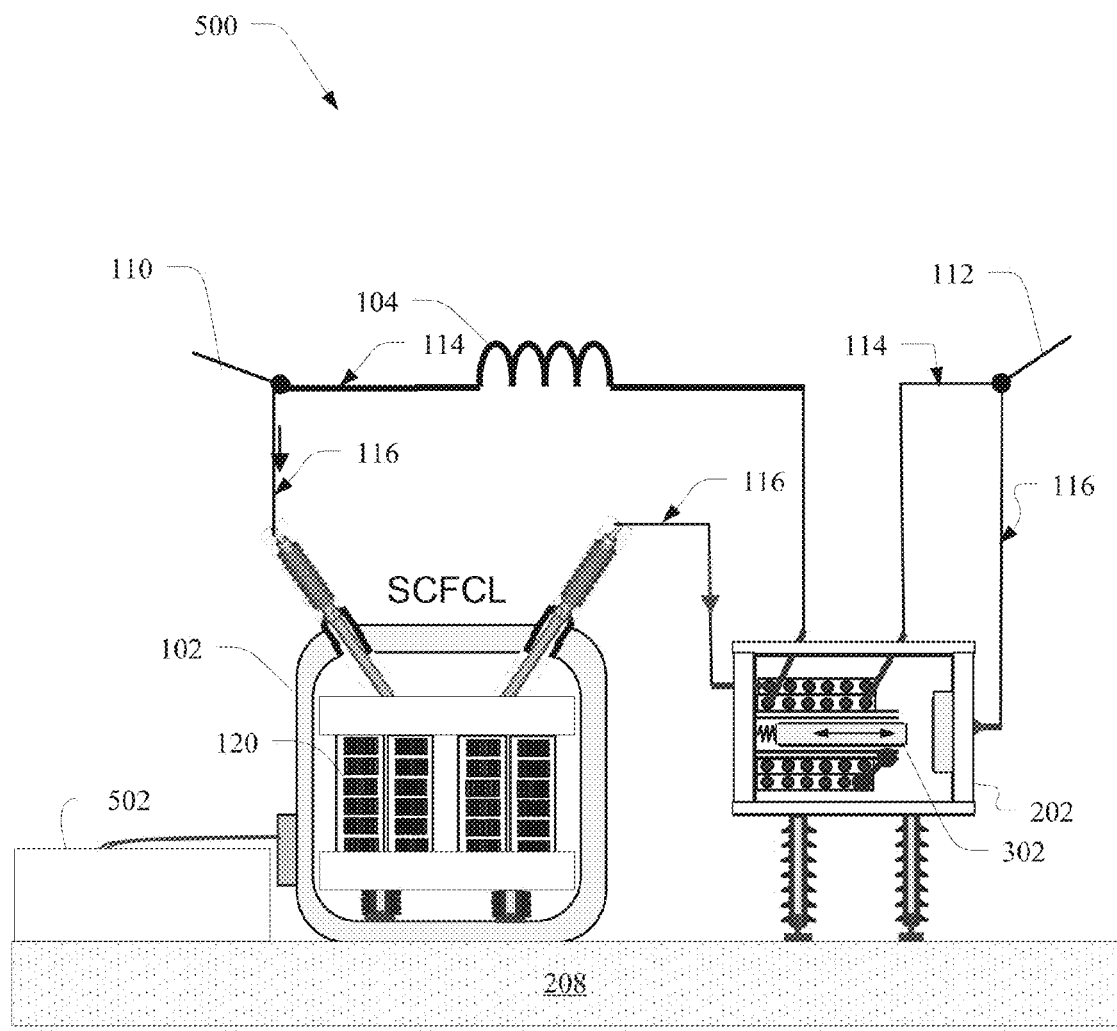
FIG. 5 depicts an additional current limiting system consistent with an additional embodiment.

FIG. 5 depicts an additional current limiting system consistent with an additional embodiment of the disclosure. In this embodiment, the SCFCL system 500 includes generally the same components as detailed above for SCFCL system 200, except for the differences noted below. In particular, the SCFCL system 500 is arranged in what is termed a "dead tank" configuration that does not include the high voltage insulation 206. The dead tank configuration refers to an SCFCL device with a grounded cryostat 502 or other cooling system, where the high voltage insulation resides inside the cryostat. In a live tank SCFCL design, characteristic of the embodiments of FIGS. 1-4, the cooling system 204 is not grounded (is floating) requiring a high voltage insulation 206 in surrounding air and support structures. Similarly, in various embodiments, the protection component such as an electromagnetic switch protection switch or circuit breaker device, may be arranged in a live tank or dead tank configuration (the live tank configuration is illustrated for the protection switch 202 of FIGS. 2-4D.)

Figure 6:
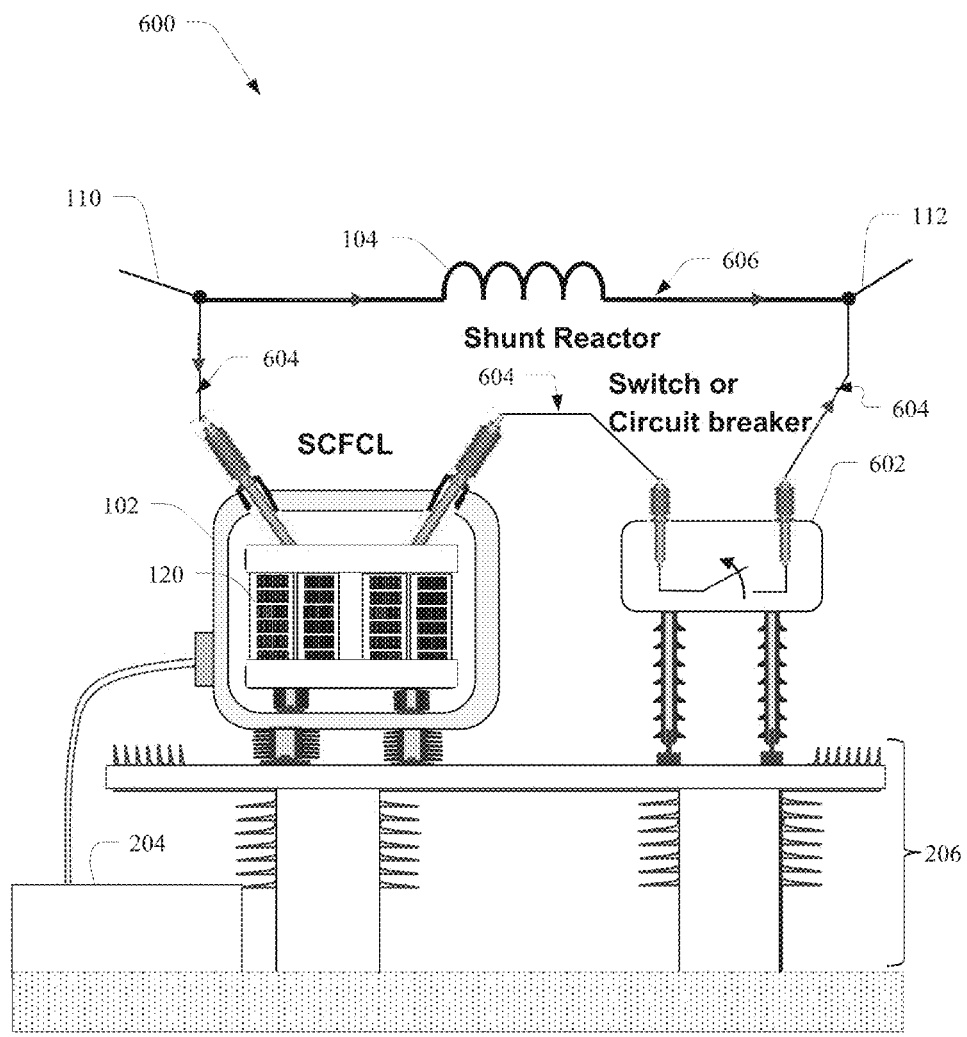
FIG. 6 depicts still another additional current limiting system consistent with a further embodiment.

FIG. 6 depicts still another additional current limiting system consistent with a further embodiment. The SCFCL system 600 includes the same components as described above for SCFCL system 200 except that a circuit breaker 602 is provided instead of an electromagnetic switch. Accordingly, during a fault condition when excessive current is initially drawn between entry point 110 and exit point 112, the superconductor elements 120 transition to a finite resistance state to limit current. If the current 604 still present in the electrical path 116 exceeds a threshold value, the circuit breaker 602 is configured to open the electrical path 116. Subsequently, during a recovery period any load current 606 is conducted along the electrical path 114 through shunt reactor 104. During this time the superconductor elements 120 may recover to a superconducting state without any current present until the circuit breaker 602 is reset.

Figure 8:
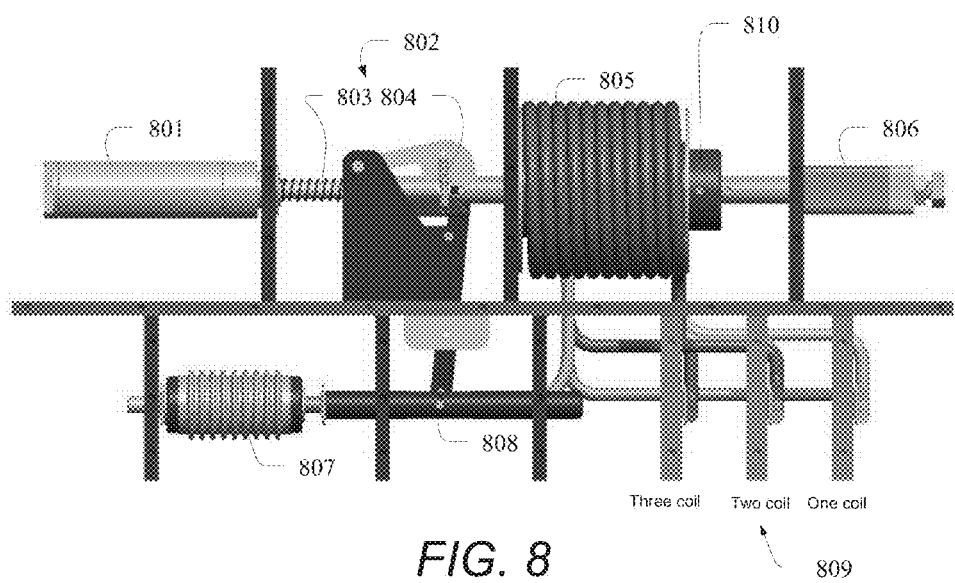
FIG. 8 shows detailed mechanisms of a recovery electromagnetic switch.

FIG. 8 depicts still another additional electromagnetic switch embodiment shows a detailed mechanism that includes a regulated air cylinder and spring to control the speed of contact separation and recovery time. A recovery switch is provided, which includes a regulated air cylinder 801 that in conjunction with the spring 803, locking mechanism 802, and its spring 804, as well as the pre-travel adjustment 806, determine the speed of separation of contact 807 and recovery time. The lever arm 808 controls the circuit recovery by its connection to the lock mechanism 802 and the vacuum interrupter 807. The lever arm controls the contact separation distance between P1 and P2 (see FIG. 3B), where the contact separation distance is the main mechanism that determines the operating voltage of the protection system. The protection system can also include a variable coil arrangement 809, where the number of turns in the coil is used to vary the electromagnetic force.

In operation the recovery switch depicted herein allows normal current to pass through the switch without power interruption. When a fault occurs, the current will increase such that the magnetic field of the solenoid 805 will attract the plunger 810. This drives the shaft into the locking mechanism 802. This locks the vacuum breaker 807 in an open circuit position allowing the superconducting material to recover without any current load. The time delay for the circuit reset is controlled by the regulated air cylinder 801 and the compression spring 803. Once the lock mechanism 802 is unlocked all the components are reset to their original position allowing the electrical circuit to be complete.

In summary, the present embodiments provide a protection system that user current that is conventionally conducted within a superconducting current limiting system to afford an automatic current limiting function as in conventional systems together with a mechanism to speed up recovery of SCFCL components. This avoids the use of complex circuitry and also affords the ability to reduce the amount of superconductor material used in SCFCL systems because of the greater ability to recover rapidly from fault conditions.

The use or application of the present embodiments and the protection system in general is not limited to SCFCL protection. For example, the present embodiments may be employed for any type of fault current limiting (FCL) devices such as solid state FCL, saturated iron FCL, and others. Embodiments may also be used as an aid to conventional circuit breakers to speed up fault clearing operations. In some applications where there is no need for a complex fault clearing or no relay coordination systems, this simple protection system provided by the present embodiments can be used as an auto-breaking and auto-closing switch or contactor.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A current limiter system, comprising:
a superconducting fault current limiter (SCFCL) configured to conduct load current during a normal operation state in which the SCFCL is in a superconducting state;
a shunt reactor connected in an electrically parallel fashion to the SCFCL and configured to conduct less current than the SCFL in the normal operation state; and
a protection switch including a set of electromagnetic coils, the set of electromagnetic coils having a first coil connected in a series to the SCFCL and a second coil connected in series to the shunt reactor wherein the protection switch is configured to disconnect the SCFCL for a predetermined time from a load current path during a fault condition when fault current exceeds a threshold current value,
wherein the protection switch further comprises a central magnetic component configured to complete a first electrical path containing the SCFCL in a first position, the first coil and second coil being disposed around a same portion of the central magnetic component, and wherein the first coil is disposed around the second coil.

2. The current limiter system of claim 1, wherein the SCFCL is configured to conduct about eighty percent or greater of load current and the shunt reactor is configured to conduct about twenty percent or less of load current during the normal operation state.

3. The current limiter system of claim 1, wherein the SCFCL is configured to conduct less than twenty percent of fault current and the shunt reactor is configured to conduct greater than eighty percent of fault current during an initial fault interval when fault current exceeds the threshold current value and before the SCFCL is disconnected from the load current path.

4. The current limiter system of claim 1, wherein the SCFCL is configured to conduct zero percent of load current and the shunt reactor is configured to conduct one hundred percent of load current during a recovery period after the SCFCL is disconnected from the load current and after the load current drops below the threshold current value.

5. The current limiter system of claim 1, wherein the set of electromagnetic coils is configured to exert a force effective to move the central magnetic component from the first position to a second position in which the first electrical path forms an open circuit when the fault current exceeds the threshold current.

6. The current limiter system of claim 5 further comprising a spring connected to the central magnetic component and having a spring time constant configured to move the central magnetic component from the second position to the first position within a return period comprising one to twenty seconds after fault current drops below the current threshold subsequent to the fault condition.

7. The current limiter system of claim 6, wherein the return period comprises one to six seconds.

8. The current limiter system of claim 5, further comprising an air cylinder, spring and lock mechanism connected to the central magnetic component and having a recovery time delay constant configured to move the central magnetic component from the second position to the first position within a return period comprising one to twenty seconds after fault current drops below the threshold current subsequent to the fault condition.

9. The current limiter system of claim 8, wherein the return period comprises one to six seconds.

10. The current limiter system of claim 5, further comprising a lever arm connected to the central magnetic component and having an opening speed time configured to move the central magnetic component from the first position to the second position within an actuation time comprising four to one hundred milli seconds after fault condition is initiated.

11. The current limiter system of claim 5, wherein the second coil is configured to transmit the load current when the central magnetic component is in the second position.

12. The current limiter system of claim 1, further comprising a monitor system configured to receive power from current drawn through the first and/or second coil.

13. A superconducting fault current limiter (SCFCL) system arranged in an electrical circuit comprising:
a first electrical path containing an SCFCL configured to conduct load current during a normal operation state in which the SCFCL is in a superconducting state;
a second electrical path electrically parallel to the first electrical path and containing a shunt reactor configured to conduct less current than the SCFL in the normal operation state; and
a protection component comprising:
a set of electromagnetic coils, the set of electromagnetic coils having a first coil connected in series to the SCFCL, a second coil connected in series to the shunt reactor; and
a central magnetic component configured in a first position to complete the first electrical path, the first coil and second coil being disposed around a same portion of the central magnetic component, wherein the first coil is disposed around the second coil,
wherein the protection component is configured to create an open circuit along the first electrical path containing the SCFCL for a predetermined time during a fault condition when fault current exceeds a threshold current value, wherein no current is conducted through the SCFCL during the predetermined time.

14. The SCFCL system of claim 13, wherein the set of electromagnetic coils is configured to exert a force effective to move the central magnetic component from the first position to a second position in which the first electrical path forms an open circuit when the fault current exceeds the threshold current.

15. The SCFCL system of claim 13, wherein the first electrical path comprises the SCFCL, the first coil, and the central magnetic component.

16. The SCFCL system of claim 13, wherein the SCFCL is configured to conduct approximately one hundred percent of load current and the shunt reactor is configured to conduct approximately zero percent of load current during the normal operation state when total load current is less than 2000 A.

17. The current limiter system of claim 13, wherein the SCFCL is configured to conduct less than twenty percent of fault current and the shunt reactor is configured to conduct greater than eighty percent of fault current during an initial fault interval when load current exceeds 5 kA, and before the SCFCL is disconnected from the load current path.

18. A current limiter system, comprising:
a superconducting fault current limiter (SCFCL) configured to conduct load current during a normal operation state in which the SCFCL is in a superconducting state;
a shunt reactor connected in an electrically parallel fashion to the SCFCL and configured to conduct less current than the SCFL in the normal operation state; and
a protection switch including a set of electromagnetic coils, the set of electromagnetic coils having a first coil connected in a series to the SCFCL and a second coil connected in series to the shunt reactor wherein the protection switch is configured to disconnect the SCFCL for a predetermined time from a load current path during a fault condition when fault current exceeds a threshold current value,
wherein the protection switch further comprises a central magnetic component configured to complete a first electrical path containing the SCFCL in a first position, the first coil and second coil being disposed around a same portion of the central magnetic component; and
a spring connected to the central magnetic component and having a spring time constant configured to move the central magnetic component from a second position in which the first electrical path forms an open circuit to the first position within a return period comprising one to twenty seconds after fault current drops below the current threshold subsequent to the fault condition.

19. The current limiter system of claim 18, wherein the return period comprises one to six seconds.

* * * * *